(12) United States Patent
Chandrachood et al.

(10) Patent No.: US 7,955,516 B2
(45) Date of Patent: *Jun. 7, 2011

(54) ETCHING OF NANO-IMPRINT TEMPLATES USING AN ETCH REACTOR

(75) Inventors: Madhavi R. Chandrachood, Sunnyvale, CA (US); Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 833 days.

This patent is subject to a terminal disclaimer.

(21) Appl. No.: 11/836,258

(22) Filed: Aug. 9, 2007

(65) Prior Publication Data

US 2008/0105649 A1  May 8, 2008

Related U.S. Application Data

(60) Provisional application No. 60/864,151, filed on Nov. 2, 2006.

(51) Int. Cl.
*B44C 1/22* (2006.01)
*C03C 15/00* (2006.01)
*C03C 25/68* (2006.01)

(52) U.S. Cl. .............. 216/67; 216/68; 216/75

(58) Field of Classification Search .......... None
See application file for complete search history.

(56) References Cited

U.S. PATENT DOCUMENTS

| | | | | |
|---|---|---|---|---|
| 7,521,000 | B2 * | 4/2009 | Chandrachood et al. | 216/67 |
| 7,682,518 | B2 * | 3/2010 | Chandrachood et al. | 216/67 |
| 2005/0008945 | A1 | 1/2005 | Brooks et al. | |
| 2006/0154151 | A1 | 7/2006 | Anderson et al. | |

FOREIGN PATENT DOCUMENTS

| | | |
|---|---|---|
| CN | 1722366 A | 1/2006 |
| CN | 1791565 A | 6/2006 |
| WO | WO 01/96955 * | 12/2001 |

OTHER PUBLICATIONS

Liying Jiao, et al., "Fabrication of metallic nanostructures by negative nanoimprint lithography; Fabrication of metallic nanostructures by negative nanoimprint lithography", Nanotechnology, IOP, Bristol, GB, vol. 16, No. 12, Dec. 1, 2005, pp. 2779-2784.

(Continued)

*Primary Examiner* — Duy-Vu N Deo
(74) *Attorney, Agent, or Firm* — Patterson & Sheridan, L.L.P.

(57) ABSTRACT

Methods for etching a metal layer using an imprinted resist material are provided. In one embodiment, a method for processing a photolithographic reticle includes providing a reticle having a metal photomask layer formed on an optically transparent substrate and an imprinted resist material deposited on the metal photomask layer, etching recessed regions of the imprinted resist material to expose portions of the metal photomask layer in a first etching step, and etching the exposed portions of the metal photomask layer through the imprinted resist material in a second etching step, wherein at least one of the first or second etching steps utilizes a plasma formed from a processing gas comprising oxygen, halogen and chlorine containing gases. In one embodiment, the process gas is utilized in both the first and second etching steps. In another embodiment, the first and second etching steps are performed in the same processing chamber.

17 Claims, 4 Drawing Sheets

OTHER PUBLICATIONS

Resnick, D.J., et al., "Step & flash imprint lithography", Materials Today, Elsevire Science, Kidlington, GB, vol. 8, No. 2, Feb. 2005, pp. 34-42.
EP Search Report for EP 07020929 dated Feb. 6, 2008, consists of 5 pages.
Official Letter dated Apr. 14, 2010 from Chinese Patent Office for corresponding Chinese Patent Application No. 200710149503.5.
Official Letter dated Oct. 29, 2010 from Chinese Patent Office for corresponding Chinese Patent Application No. 200710149503.5.

* cited by examiner

ETCHING OF NANO-IMPRINT TEMPLATES USING AN ETCH REACTOR

CROSS REFERENCE TO RELATED APPLICATIONS

This application claims benefit of U.S. Provisional Patent Application Ser. No. 60/864,151, filed Nov. 2, 2006, which is incorporated by reference in its entirety.

BACKGROUND

1. Field

Embodiments of the present invention relate to the fabrication of structures using nano-imprint technology.

2. Background of the Related Art

UV nano-imprint technology is utilized for the fabrication of micro- and nano-structures. Nano-imprint is a mechanical replication technology wherein a mold is pressed into a UV curable resist that was spin-coated on a substrate. UV irradiation of the resist through the mold in the imprinted area leads to the polymerization and curing of the resist. The mold is then removed leaving the inverted three dimensional replica of the pattern formed in the resist. The thin portions of the imprinted resist are removed to create openings in the resist layer, forming a mask that is then utilized to etch one or more layers underlying the resist. This technique enables fast high precision printing down to 10 nm spacing and pattern fidelity to a large extent.

However, most conventional etching processes, such as wet etching that tend to etch isotropically, are not suitable for robustly transferring such small patterns to the underlying material. Particularly, undercutting phenomenon can produce patterned features on the etched underlying material that are not uniformly spaced and do not have desired straight, vertical sidewalls, thereby losing the critical dimensions of the features. Additionally, the isotropic etching of the features may overetch the sidewalls of features in high aspect ratios, resulting in the loss of the critical dimensions of the features.

Plasma etch processing, known as dry etch processing or dry etching, provides a more anisotropic etch than wet etching processes. The dry etching process has been shown to produce less undercutting and to improve the retention of the critical dimensions of the photomask features formed using conventional lithographic techniques with straighter sidewalls and flatter bottoms. However, dry etching may overetch or imprecisely etch the sidewalls of the openings or pattern formed in the resist material used to define the critical dimensions of the underlying layer. Excess side removal of the resist material results in a loss of the critical dimensions of the patterned resist features, which may translate to a loss of critical dimensions of the features formed in the underlying layer defined by the patterned resist. Further, imprecise etching may not sufficiently etch the features to provide the necessary critical dimensions. Failure to sufficiently etch the features to the critical dimensions is referred to as a "gain" of critical dimensions. The degree of loss or gain of the critical dimensions in the metal layer is referred to as "etching bias" or "CD bias".

Although loss of critical dimension control is of concern in most all etching applications, it is particularly problematic in photomask fabrication. The loss or gain of critical dimensions of the pattern formed in the underlying layer(s) comprising a photomask reticle can detrimentally affect the light passing therethrough and produce numerous patterning defects and subsequent etching defects in substrates patterned by the photolithographic reticle. The loss or gain of critical dimensions of the photomask can result in insufficient photolithographic performance for etching high aspect ratios of submicron features and, if the loss or gain of critical dimensions is severe enough, the failure of the photolithographic reticle or subsequently etched device. Since nano-imprint technology can produce very small apertures, conventional etching techniques do not allow effective pattern transfer to the layers underlying the imprinted resist to a degree acceptable for robust photomask fabrication.

Therefore, there remains a need for a process and chemistry suitable for fabrication of structures using nano-imprint technology.

SUMMARY OF THE INVENTION

Methods for etching a metal layer using an imprinted resist material are provided. The methods provided herein are particularly suitable for, but not limited to, photomask reticle fabrication.

In one embodiment, a method is provided for processing a photolithographic reticle that includes providing a reticle having a metal photomask layer formed on an optically transparent substrate and an imprinted resist material deposited on the metal photomask layer, etching recessed regions of the imprinted resist material to expose portions of the metal photomask layer in a first etching step, and etching the exposed portions of the metal photomask layer through the imprinted resist material in a second etching step, wherein at least one of the first or second etching steps utilizes a plasma formed from a processing gas comprising an oxygen containing gas, a chlorine containing gas and a halogen containing gas.

In another embodiment, the process gas is utilized in both the first and second etching steps includes an oxygen containing gas, a chlorine containing gas and a halogen containing gas.

In another embodiment, the process gas is utilized in both the first and second etching steps have different ratios of oxygen containing gas, chlorine containing gas and halogen containing gas.

In another embodiment, the first and second etching steps are performed in the same processing chamber.

BRIEF DESCRIPTION OF THE DRAWINGS

So that the manner in which the above recited aspects of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures. It is contemplated that features of one embodiment may be beneficially incorporated in other embodiments without further recitation.

DETAILED DESCRIPTION

Aspects of the invention will be described below in reference to an inductively coupled plasma etch chamber. Suitable inductively coupled plasma etch chambers include the Tetra™ family of photomask etch chambers, or optionally, a Decoupled Plasma Source (DPS I™, DPS II™, and DPS Plus™) processing chambers, all available from Applied Materials, Inc., of Santa Clara, Calif.

Other process chambers may be used to perform the processes of the invention, including, for example, capacitively coupled parallel plate chambers and magnetically enhanced ion etch chambers as well as inductively coupled plasma etch chambers of different designs. Examples of such suitable processing chambers are disclosed in U.S. patent application Ser. No. 09/325,026, filed on Jun. 3, 1999, U.S. patent application Ser. No. 11/554,502, filed on Oct. 30, 2006, and in U.S. patent application Ser. No. 11/554,495, filed on Oct. 30, 2006, which are incorporated by reference. Although the processes are advantageously performed with the Tetra™ photomask etch chamber, the description of the processing chamber is illustrative, and should not be construed or interpreted to limit the scope of any aspect of the invention. It is also contemplated that the invention may be beneficially practiced in other processing chambers, including those from other manufacturers.

Figure 1:
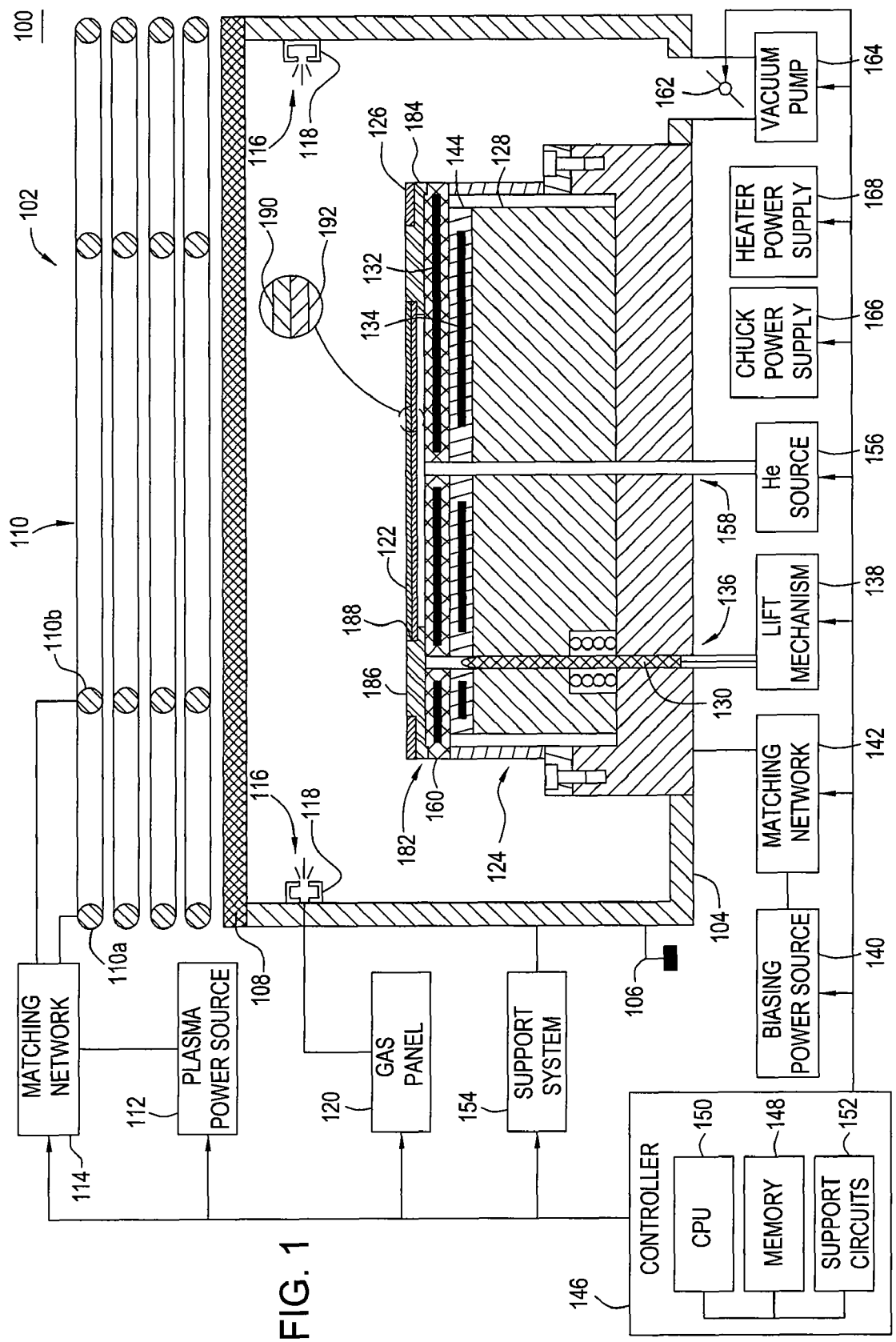
FIG. 1 is a schematic cross-sectional view of one embodiment of an etching chamber.

FIG. 1 is a schematic cross-sectional view of one embodiment of a processing chamber 100 generally comprising a process chamber body 102 having a substrate pedestal 124, and a controller 146. The chamber body 102 has a conductive wall 104 that supports a substantially flat dielectric ceiling 108. Other embodiments of the processing chamber 100 may have other types of ceilings, e.g., a dome-shaped ceiling. An antenna 110 is disposed above the ceiling 108. The antenna 110 comprises one or more inductive coil elements that may be selectively controlled (two co-axial elements 110a and 110b are shown in FIG. 1). The antenna 110 is coupled through a first matching network 114 to a plasma power source 112. The plasma power source 112 is typically capable of producing up to about 3000 Watts (W) at a tunable frequency in a range from about 50 kHz to about 13.56 MHz.

The substrate pedestal (cathode) 124 is coupled through a second matching network 142 to a biasing power source 140. The biasing source 140 provides between about zero to about 600 W at a tunable pulse frequency in the range of about 1 to about 10 kHz. The biasing source 140 produces pulsed RF power output. Alternatively, the biasing source 140 may produce pulsed DC power output. It is contemplated that the source 140 may also provide a constant DC and/or RF power output.

In one embodiment, the substrate support pedestal 124 includes an electrostatic chuck 160. The electrostatic chuck 160 comprises at least one clamping electrode 132 and is controlled by a chuck power supply 166. In alternative embodiments, the substrate pedestal 124 may comprise substrate retention mechanisms such as a susceptor clamp ring, a vacuum chuck, a mechanical chuck, and the like.

A gas panel 120 is coupled to the processing chamber 100 to provide process and/or other gases to the interior of the process chamber body 102. In the embodiment depicted in FIG. 1, the gas panel 120 is coupled to one or more inlets 116 formed in a channel 118 in the sidewall 104 of the chamber body 102. It is contemplated that the one or more inlets 116 may be provided in other locations, for example, in the ceiling 108 of the processing chamber 100.

The pressure in the processing chamber 100 is controlled using a throttle valve 162 and a vacuum pump 164. The vacuum pump 164 and throttle valve 162 are capable of maintaining chamber pressures in the range of about 1 to about 20 mTorr.

The temperature of the wall 104 may be controlled using liquid-containing conduits (not shown) that run through the wall 104. Wall temperature is generally maintained at about 65 degrees Celsius. Typically, the chamber wall 104 is formed from a metal (e.g., aluminum, stainless steel, and the like) and is coupled to an electrical ground 106. The processing chamber 100 also comprises conventional systems for process control, internal diagnostic, end point detection, and the like. Such systems are collectively shown as support systems 154.

A reticle adapter 182 is used to secure a substrate (such as a reticle or other workpiece) 122 onto the substrate support pedestal 124. The reticle adapter 182 generally includes a lower portion 184 milled to cover an upper surface of the pedestal 124 (for example, the electrostatic chuck 160) and a top portion 186 having an opening 188 that is sized and shaped to hold the substrate 122. The opening 188 is generally substantially centered with respect to the pedestal 124. The adapter 182 is generally formed from a single piece of etch resistant, high temperature resistant material such as polyimide ceramic or quartz. A suitable reticle adapter is disclosed in U.S. Pat. No. 6,251,217, issued on Jun. 26, 2001, and incorporated herein by reference. An edge ring 126 may cover and/or secure the adapter 182 to the pedestal 124.

A lift mechanism 138 is used to lower or raise the adapter 182, and hence, the substrate 122, onto or off of the substrate support pedestal 124. Generally, the lift mechanism 138 comprises a plurality of lift pins (one lift pin 130 is shown) that travel through respective guide holes 136.

In operation, the temperature of the substrate 122 is controlled by stabilizing the temperature of the substrate pedestal 124. In one embodiment, the substrate support pedestal 124 comprises a heater 144 and an optional heat sink 128. The heater 144 may be one or more fluid conduits configured to flow a heat transfer fluid therethrough. In another embodiment, the heater 144 may include at least one heating element 134 that is regulated by a heater power supply 168. Optionally, a backside gas (e.g., helium (He)) from a gas source 156 is provided via a gas conduit 158 to channels that are formed in the pedestal surface under the substrate 122. The backside gas is used to facilitate heat transfer between the pedestal 124 and the substrate 122. During processing, the pedestal 124 may be heated by the embedded heater 144 to a steady-state temperature, which in combination with the helium backside gas, facilitates uniform heating of the substrate 122.

The controller 146 comprises a central processing unit (CPU) 150, a memory 148, and support circuits 152 for the CPU 150 and facilitates control of the components of the processing chamber 100 and, as such, of the etch process, as discussed below in further detail. The controller 146 may be one of any form of general-purpose computer processor that can be used in an industrial setting for controlling various chambers and sub-processors. The memory 148 of the CPU 150 may be one or more of readily available memory such as random access memory (RAM), read only memory (ROM), floppy disk, hard disk, or any other form of digital storage, local or remote. The support circuits 152 are coupled to the CPU 150 for supporting the processor in a conventional manner. These circuits include cache, power supplies, clock circuits, input/output circuitry and subsystems, and the like. The inventive method is generally stored in the memory 148 or other computer-readable medium accessible to the CPU 150 as a software routine. Alternatively, such software routine may also be stored and/or executed by a second CPU (not shown) that is remotely located from the hardware being controlled by the CPU 150.

While the following process description illustrates one embodiment of etching a substrate using processing gases as described herein, the invention contemplates the use of processing parameters outside the ranges described herein for performing this process in different apparatus, such as a different etching chamber, and for different substrate sizes, such as photolithographic reticles for 200 mm and/or 300 mm substrate processing.

Exemplary Etch Process

While the following description illustrates one embodiment of a process sequence for etching metal layers, such as chromium and chromium oxynitride, as photomasks in photolithographic reticle fabrication, it is contemplated that the etching gases may be used to etch other material layers formed on substrates in semiconductor and photolithographic reticle manufacturing.

Generally a photolithographic reticle includes an opaque layer, known as a photomask, deposited on an optically transparent substrate. The opaque layer may comprise a metal layer, for example, chromium, or another material known or unknown in the art suitable for use as a photomask. For example, the invention contemplates that the opaque layer may comprise a non-metallic dielectric material. An optically transparent material of the substrate 122 is broadly defined to include, but not limited to, a material transparent to light having wavelengths of about 300 nanometers (nm) or less, for example, transparent to ultraviolet light having wavelengths of 248 nm and 193 nm.

Figure 2:
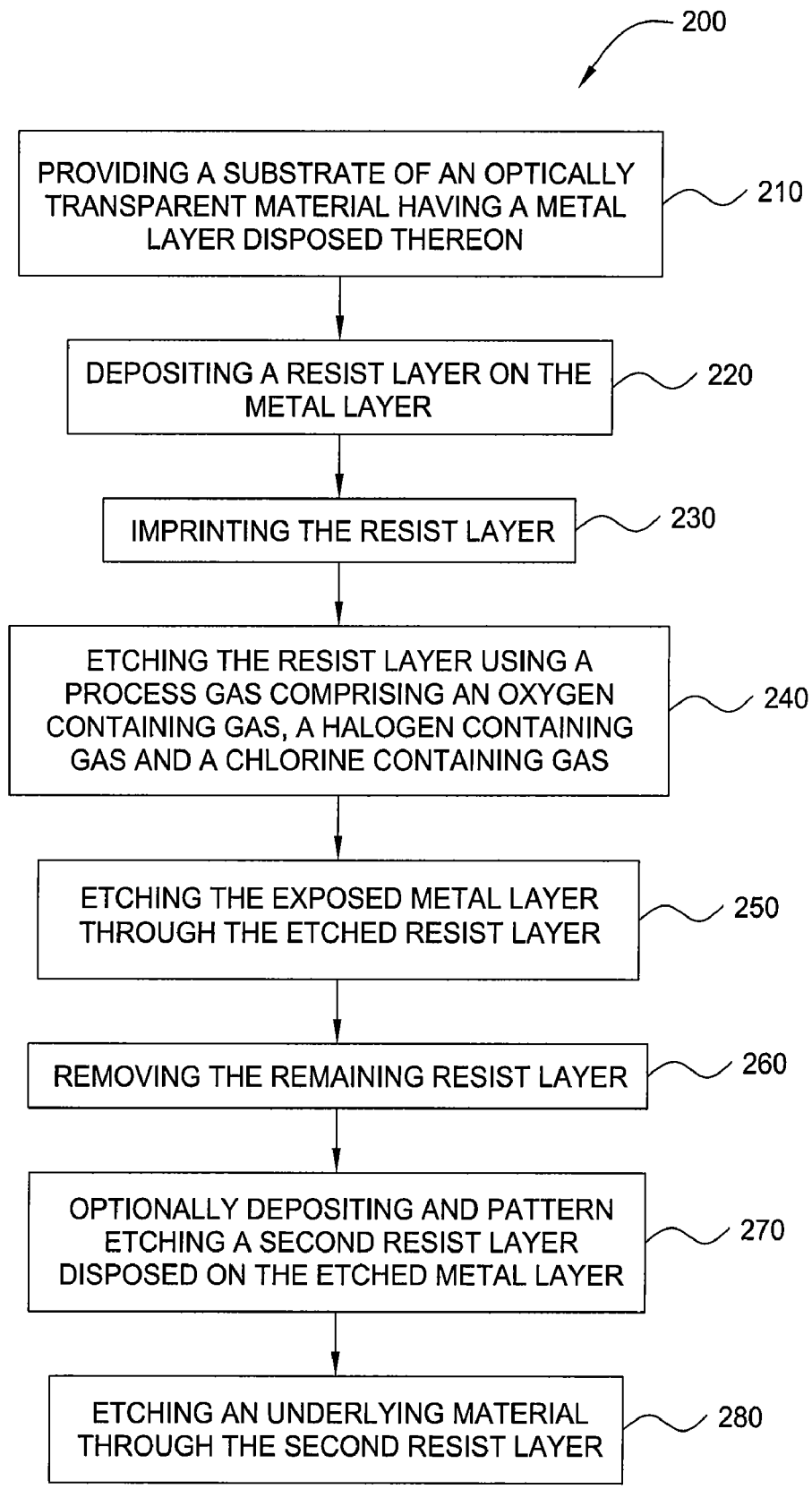
FIG. 2 is a flow chart illustrating one embodiment of a sequence for processing a substrate according to one embodiment of the invention.

FIG. 2 is a flow chart of one embodiment of one process sequence of an etching process 200 suitable for etching a metal layer through an imprinted resist layer. The flow chart is provided for illustrative purposes and should not be construed as limiting the scope of any aspects of the invention. FIGS. 3A-3G illustrate the composition of the photolithographic reticle at points during the photomask forming process as well as further illustrate the process described above in FIG. 2.

The substrate 122, typically comprising an optically transparent material 310, such as optical quality quartz, fused silica material, molybdenum silicide (MoSi), molybdenum silicon oxynitride ($MoSi_xN_yO_z$), calcium fluoride, alumina, sapphire, or combinations thereof, is provided to a processing chamber at block 210, such as the processing chamber 100 of FIG. 1.

Figure 3A:
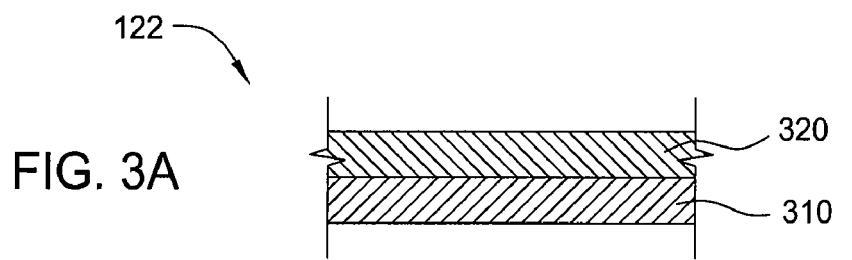
FIGS. 3A-3G are cross-sectional views showing an etching sequence of another embodiment of the invention.

The substrate 122 has an opaque metal layer 320 as a metal photomask layer, typically comprising chromium, disposed on the substrate material 310, as shown in FIG. 3A. The chromium layer may be deposited by conventional methods known in the art, such as by physical vapor deposition (PVD) or chemical vapor deposition (CVD) techniques. The metal layer 320 is typically deposited to a thickness between about 50 and about 100 nm; however, the thickness of the metal layer 320 may differ based upon the requirements of the manufacturer and the composition of the materials of the substrate or metal layer.

Optionally, an anti-reflective coating (ARC or ARC layer) may be formed on or comprise part of the deposited metal layer 320. The ARC layer is believed to improve photolithographic precision in patterning features to be formed in the opaque layer. The ARC layer may be a metal layer incorporating nonmetallic contaminants or impurities to form, for example a metal oxynitride layer, such as chromium oxynitride. Chromium oxynitride may be formed during deposition of the metal layer or by exposing the metal layer to a suitable atmosphere, such as an oxidizing and nitrating environment. Alternatively, the chromium oxynitride layer may be deposited by conventional methods known in the art, such as by physical vapor deposition (PVD) or chemical vapor deposition (CVD) techniques. The metal oxynitride layer may comprise up to the top 25 percent of the total thickness of the metal layer 320.

The optional ARC layer is typically formed at a thickness between about 10 nm and about 15 nm; however, the thickness of the layer may differ based upon the requirements of the manufacturer and the composition of the materials of the substrate or metal layer, and may be mainly concentrated in the upper surface of the deposited material, such as the upper 30 percent of the thickness of the original metal layer 320. The chromium oxynitride film is believed to be more sensitive to etching with oxygen radicals than chromium films. A reduced amount of oxygen in the processing gas may be used to effectively etch the chromium oxynitride surface compared to etching the bulk of the remaining chromium material.

Figure 3B:
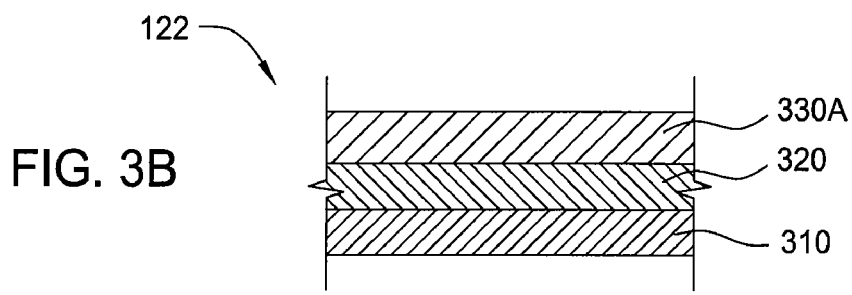

A resist layer 330A is deposited on the metal layer 320 at block 220. In one embodiment, the resist layer material is usually low temperature resist material, which is defined herein as a polymeric material that thermally degrade at temperatures above about 250 degrees Celsius, an example of which includes "ZEP," manufactured by Hoya Corporation, among others. The resist layer 330A may be applied to the metal layer 320 via a spin-coating or other method. The resist material 330A may be deposited upon the metal layer 320 to a thickness between about 200 nm and about 600 nm, as shown in FIG. 3B.

Figure 3C:
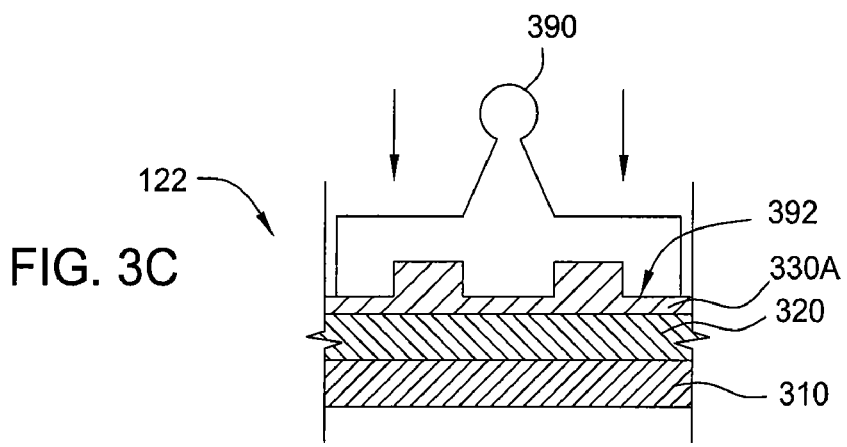
Figure 3D:
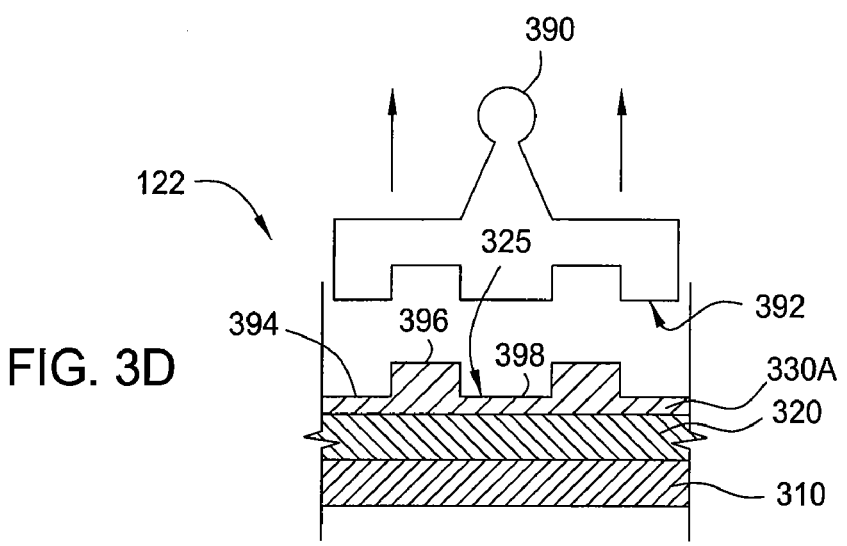

At block 230, the resist layer 330A is imprinted to form an imprinted resist layer 330B, as shown in the sequence depicted in FIGS. 3C-D. In one embodiment, the resist layer 330A is contacted by a patterned surface 392 of a mold 390. The soft resist material of the layer 330A conforms to the patterned mold surface 392.

In one embodiment, the mold 390 is generally made of a material that is transmissive to energy that cures the resist material. Energy is provided to cure the resist material which remains in contact with the mold 390, such that when the mold 390 is removed, the pattern 392 leaves an inverse imprint 394 on the cured resist material to form the imprinted resist layer 330B. The imprint 394 generally includes a plurality of recessed surfaces 398 surrounded by a plurality of raised surfaces 396, as shown in FIG. 3D. The recessed surfaces 398 may be coplanar (i.e., have a common depth relative to the raised surfaces 396) or may be parallel at different elevations.

Figure 3E:
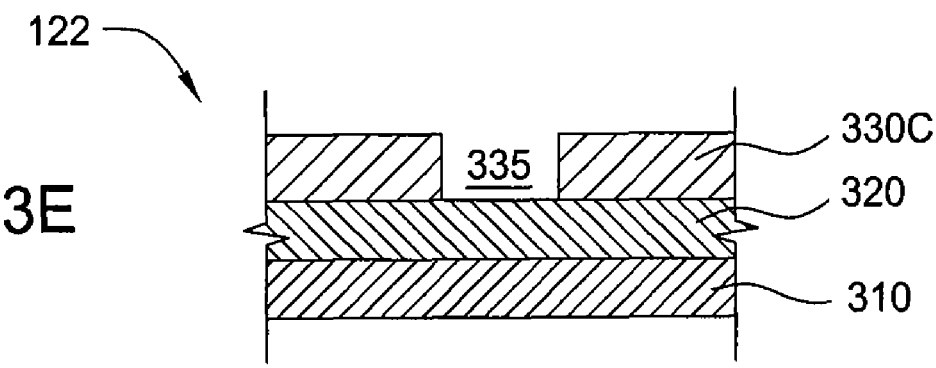

The substrate 122 is then transferred to an etch chamber, such as the processing chamber 100 described above, for forming the patterned resist mask and etching the metal layer 320 at block 240. In one embodiment, the openings or patterns in the metal layer 320 for formed by etching the imprinted resist layer 330B. Regions (later referred to as "pattern 325") of the imprinted resist layer 330B defined by the recessed surfaces 398 are etched through to expose portions the metal layer 320, thereby creating a patterned mask 330C from the imprinted resist layer 330B, as shown in FIG. 3E. The imprinted resist layer 330B may be etched using any suitable chemistry, or with the same chemistry utilized to etch the metal layer 320 described below, for form an opening 335 having the dimension of the pattern 325. Utilizing the same chemistry to etch both the imprinted resist layer 330B and the metal layer 320 advantageously reduces the number of process gases need, along with simplifying chamber design. This provides both a cost and throughput advantage as extra gases, gas connections and purge cycles may be eliminated.

Alternatively, the patterned mask 330C may be formed prior to placement in the processing chamber 100 by optically using a laser patterning device or by another radiative energy patterning device, such as an electron beam emitter to form the pattern 325 that is used to define the dimensions of the feature definition to be formed in the metal layer 320.

Figure 3F:
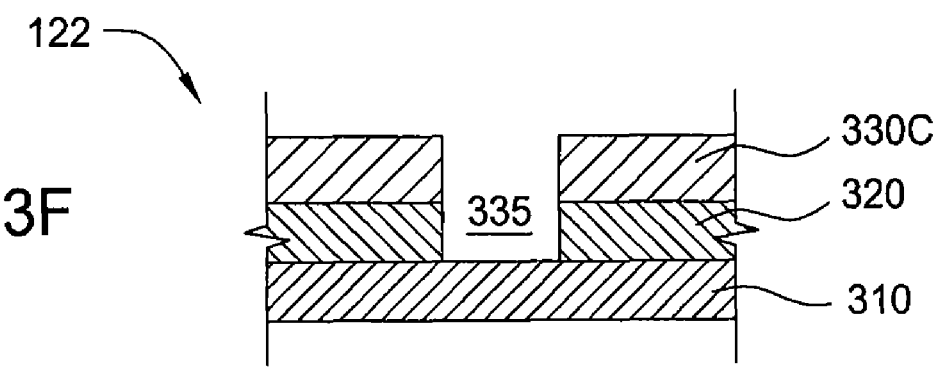

The opaque, metal layer 320 then is etched in the processing chamber 100 at block 250. The patterns (i.e., dimensions of the pattern 325) are transferred to the metal layer 320 by etching the metal layer to expose the underlying optically transparent substrate material, and optionally, an ARC layer, as shown in FIG. 3F, by extending the opening 335.

Etching of exposed portions of the opaque metal layer 320 occurs by generating a plasma of a processing gas by supplying a source power and/or a bias power to the processing chamber 100. The processing gas for etching the metal layer 320 (and, in one embodiment, the imprinted resist layer 330B) generally includes an oxygen containing gas, a chlorine containing gas and a halogen containing gas. In one embodiment, no inert gases are included in the processing gas.

The oxygen containing gas may include at least one of oxygen (O, $O_2$, or $O_3$), carbon monoxide (CO), or carbon dioxide ($CO_2$), among others. In one embodiment, the oxygen containing gas is oxygen is oxygen ($O_2$). The oxygen containing gas provides a source of etching radicals. Carbon monoxide (CO) and carbon dioxide ($CO_2$) gases, when selected, may provide a source of material for forming passivating polymer deposits, which may improve etch bias.

The chlorine containing gas may include at least one of chlorine gas ($Cl_2$), carbon tetrachloride ($CCl_4$) or hydrogen chloride (HCl), among others. In one embodiment, the chlorine containing gas is $Cl_2$. The chlorine containing gas is used to supply highly reactive radicals to etch the metal layer. The chlorine containing gas provides a source of etching radicals and components, such as carbon tetrachloride ($CCl_4$) gas, that may provide a source of material for forming passivating polymer deposits, which may improve etch bias.

The halogen containing gas may be at least one of hydrogen bromide (HBr), hydrogen iodide (HI), trifluoromethane ($CHF_3$), sulfur hexafluoride ($SF_6$), hexafluoroethane ($C_2F_6$) or ammonia ($NH_3$), among others. The halogen containing gas may be selected to increase the etch selectivity of chromium to photoresist, and reduce etch bias.

In one embodiment, the halogen containing gas is hydrogen bromide (HBr). Hydrogen bromide may also be delivered to processing from an aqueous solution or have an aqueous component as hydrobromic acid. The halogen containing gas may be used to supply both reactive radicals to etch the metal layer as well as hydrogen, which may reduce photoresist and metal etch rates and passivate the photoresist and metal sidewalls to minimize overetching and preserve desired critical dimensions, and improve etch bias.

The chlorine containing gas and the halogen containing gas may be provided in a molar ratio of chlorine containing gas to the halogen containing gas between about 10:1 and about 0.5:1, for example, a chlorine to hydrogen bromide molar ratio between about 10:1 and about 0.5:1.

Optionally, the processing gas may also include an inert gas which, when ionized as part of the plasma including the processing gas, results in sputtering species to increase the etching rate of the features. The presence of an inert gas as part of the plasma may also enhance dissociation of the active processing gases. Consequently, the inert gas helps to control the radial etch rate. The etch rate may be controlled to be center fast or center slow. Examples of inert gases include argon (Ar), helium (He), neon (Ne), xenon (Xe), krypton (Kr), and combinations thereof, of which argon and helium are generally used. The inert gases, when used, may comprise between about 5 volume percent and about 40 volume percent, such as between about 15 volume percent and about 25 volume percent of the total gas flow for the process. For plasma striking to initiate the plasma prior to introducing the etching processing gas, the inert gas may comprise between about 75 volume percent and about 100 volume percent of the process gas used.

The total flow rate of the processing gas, including the inert gas, may be introduced in to the chamber 100 at a flow rate between about 40 sccm and about 2100 sccm for etching a 150 mm by 150 mm square photolithographic reticles. The oxygen containing gas may be introduced into the processing chamber 100 at a flow rate between about 5 sccm and about 1000 sccm, for example, about 20-50 sccm. The chlorine containing gas may be introduced into the processing chamber 100 at a flow rate of between about 25 sccm and about 1000 sccm, for example, about 150-300 sccm. The halogen containing gas may be introduced into the processing chamber 100 at a flow rate of between about 0 sccm and about 100 sccm, for example, between about 1-5 sccm. When the inert gas is utilized, a flow rate between about 5 sccm and about 100 sccm, for example 20-45 sccm, may be provided.

The individual and total gas flows of the processing gases may vary based upon a number of processing factors, such as the size of the processing chamber 100, the size of the substrate 122 being processed, and the specific etching profile desired by the operator.

Generally, a source RF power level of about 15000 Watts or less is applied to an inductor coil to generate and sustain a plasma of the processing gases during the etching process. A power level between about 0 Watts and about 1500 Watts, such between about 0 to 800 Watts or about 300-350 Watts, has been observed to provide sufficient plasma of the processing gases for etching the substrate surface. The recited source RF power levels have been observed to produce sufficient etching radicals and polymerization radicals from the processing gases to etch the exposed metal layer disposed on the substrate while providing a sufficiently low power level, compared to prior art metal etch processes, for the substrate temperatures to be about 150 degrees Celsius or less.

Generally, a bias power of less than about 200 Watts is applied to the substrate 122 to increase directionality of the etching radicals with respect to the surface of the substrate 122. A bias power of less than about 100 Watts may be used in the etching process. A bias between about 15 Watts and 20 Watts has been observed to provide sufficient directionality of etching radicals during the etching process.

Generally, the processing chamber pressure is maintained between about 1 milliTorr and about 40 milliTorr. In one embodiment, the pressure is maintained between about 3 milliTorr and about 8 milliTorr during the etching process.

The substrate 122 is also maintained at a temperature of about 150 degrees Celsius or less during processing. A substrate temperature below about 150 degrees Celsius or less has minimal heat degradation of materials, such as resist materials, deposited on the substrate during the photolithographic reticle fabrication processes with the processing gases described herein. The substrate temperature between about 20 degrees Celsius and about 100 degrees Celsius, for example between about 20 degrees Celsius and about 50 degrees Celsius, may be used to etch photomask features with minimal heat degradation of material disposed on the substrate surface.

An example of the etching process is described as follows. The substrate 122 is disposed on the support member 124 and a processing gas as described herein is introduced into the chamber 100 and a plasma is generated or maintained to etch the metal layer 320 by introducing a processing gas of oxygen containing gas, a chlorine containing gas, and a halogen containing gas and generating a plasma from the processing gas. The plasma is generated by applying a source RF power to an inductor coil to generate and sustain a plasma of the processing gases during the etching process. A bias power is applied to the substrate support 124. The etching process is performed to etch through the recessed regions of the imprinted resist layer 330B, then through the metal layer 320 utilizing the without extinguishing the plasma formed from the process gas. Optionally, the flow ratios of the process gas components may be adjusted to be different during the resist and metal etching steps. Endpoint of the metal layer 320 etching process may be monitored by an optical emission endpoint control.

Alternatively, if an ARC material as described herein is formed on the metal layer, the ARC material may be removed with the metal layer during the metal layer etching process or may be removed by an etching process before etching of the metal layer. An example of a ARC etching process and metal layer etching process is more fully described in U.S. patent application Ser. No. 10/803,867, filed on Mar. 18, 2004, and entitled "Multi-Step Process For Etching Photomasks", which is incorporated by reference to the extent not inconsistent with the claimed aspects and disclosure herein.

The etching process described herein provides good critical dimension transfer of the imprinted features photoresist layer to chromium layer.

Figure 3G:
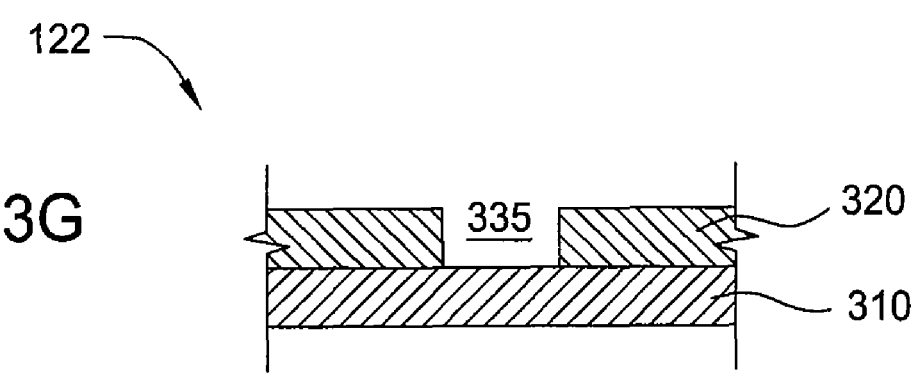

After etching of the metal layer 320 is completed, the remaining resist material of the layer 330C may be removed from the substrate 122 at block 260. The resist material may be removed by exposure to an oxygen plasma process, or other resist removal technique, as shown in FIG. 3G.

Optionally, an attenuating material may used to form an attenuating phase shift photomasks to increase the precision of the etching pattern formed on the substrate by increasing the resolution of the light passing through the photomask. An attenuating material, such as molybdenum silicide (MoSi) or derivative thereof may be disposed between the opaque metal layer 320 and the optically transparent substrate surface 310. The attenuating material may be deposited on the optically transparent substrate or may be integrated in the optically transparent substrate during manufacturing of the optically transparent substrate. For example, if an attenuating material is disposed on the substrate surface prior to deposition of the metal layer 320, the attenuating material may be formed by depositing and patterning a second resist material on the now patterned metal layer 320 to expose the underlying material at block 270. The second resist material may be pattered by imprinting and etching, as described above, or by conventional techniques. The underlying material of the attenuating material, or the exposed substrate itself if appropriate, may be then be etched with an etching gases suitable for such materials at block 280.

An example of etching the optically transparent material, such as silicon-based material, and attenuating materials of the substrate 122 is more fully described in U.S. patent application Ser. No. 10/437,729 filed on May 13, 2003, and entitled "Methods For Etching Photolithographic Reticles", and U.S. Pat. No. 6,391,790, filed on May 21, 2002, which are incorporated by reference.

The above described processing gas composition and processing regime provides controllable etching of openings or patterns with desired critical dimensions. The etching of the openings or patterns is generally anisotropic with the use of the processing gas described herein. The anisotropic process removes material deposited on the bottom of the opening at a higher rate than material on the sidewalls of the opening. This results in materials on the sidewalls of the openings being removed at a lower rate than materials on the bottoms of openings. An etch process that etches the sidewalls of the openings at a slower rate will be less likely to overetch the sidewalls allowing for improved preservation of the critical dimensions of the openings being etched, and, thus, reducing etching bias.

While the foregoing is directed to the exemplary aspects of the invention, other and further aspects of the invention may be devised without departing from the basic scope thereof, and the scope thereof is determined by the claims that follow.

What is claimed is:

1. A method for processing a photolithographic reticle, comprising:
    positioning a mold on a layer of resist material disposed on a reticle having a metal photomask layer formed on an optically transparent substrate;
    curing the resist material on the reticle;
    removing the mold to leave an imprint on the cured resist material;
    positioning the imprinted reticle on a support member in a processing chamber;
    etching recessed regions of the imprinted resist material to expose portions of the metal photomask layer using a plasma formed in the processing chamber; and
    etching the exposed portions of the metal photomask layer through the imprinted resist material the using the plasma, wherein etching recessed regions of the imprinted resist material further comprises:
    providing a first gas mixture from which the plasma is formed to the processing chamber, the first gas mixture comprising an oxygen containing gas, a halogen containing gas and a chlorine containing gas.

2. The method of claim 1, wherein etching recessed regions of the imprinted resist material further comprises:
    providing an inert gas in the first gas mixture, the inert gas comprising about 5 to about 40 percent volume of the total gas mixture.

3. The method of claim 1, wherein etching the exposed portions of the metal photomask layer further comprises:
    providing a second gas mixture from which a plasma is formed in the processing chamber, the second gas mixture comprising an oxygen containing gas, a halogen containing gas and a chlorine containing gas.

4. The method of claim 3, wherein etching recessed regions of the imprinted resist material and etching the exposed portions of the metal photomask layer are performed in-situ in the processing chamber.

5. A method for processing a photolithographic reticle, comprising:
    positioning a mold on a first layer of resist material disposed on a reticle having a metal photomask layer formed on an optically transparent substrate;
    curing the resist material on the reticle;
    removing the mold to leave an imprint on the cured resist material;
    positioning the imprinted reticle on a support member in a processing chamber;
    etching recessed regions of the imprinted resist material to expose portions of the metal photomask layer using a plasma formed in the processing chamber;
    etching the exposed portions of the metal photomask layer through the imprinted resist material the using the plasma;
    depositing a second layer of resist material on the etched metal photomask layer;
    patterning the second layer of resist material to expose an attenuating material; and plasma etching the exposed portions of the attenuating material through the patterned second of resist material to form a phase-shifting photomask.

6. The method of claim 5, wherein patterning the second layer of resist material further comprises:
imprinting the second layer of resist material;
etching recessed regions of the imprinted second layer of resist material to expose portions of the attenuating material.

7. A method for processing a photolithographic reticle, comprising:
positioning a reticle on a support member in a processing chamber, wherein the reticle comprises a metal photomask layer formed on an optically transparent substrate and an imprinted resist material deposited on the metal photomask layer;
introducing a processing gas comprising an oxygen containing gas, a chlorine containing gas, and a halogen containing gas into the processing chamber;
etching recessed regions of the imprinted resist material to expose portions of the metal photomask layer using a plasma formed from the processing gas; and
etching the exposed portions of the metal photomask layer through the imprinted resist material the using the plasma.

8. The method of claim 7, wherein etching recessed regions of the imprinted resist material further comprises:
forming the plasma from an oxygen containing gas, a halogen containing gas and a chlorine containing gas.

9. The method of claim 8, wherein the etching recessed regions of the imprinted resist material further comprises:
providing an inert gas with the oxygen containing gas, the halogen containing gas and the chlorine containing gas, the inert gas comprising about 5 to about 40 percent volume of a total gas volume used to form the plasma.

10. The method of claim 8, wherein the plasma substantially does not include an inert gas.

11. The method of claim 8, wherein etching the exposed portions of the metal photomask layer further comprises:
forming a plasma formed from an oxygen containing gas, a halogen containing gas and a chlorine containing gas.

12. The method of claim 7, wherein etching recessed regions of the imprinted resist material and etching the exposed portions of the metal photomask layer are performed in-situ in the processing chamber.

13. The method of claim 7 further comprising:
depositing a second layer of resist material on the etched metal photomask layer;
patterning the second layer of resist material to expose an attenuating material; and
plasma etching the exposed portions of the attenuating material through the patterned second of resist material to form a phase-shifting photomask.

14. The method of claim 13, wherein patterning the second layer of resist material further comprises:
imprinting the second layer of resist material.

15. A method for processing a photolithographic reticle, comprising:
providing a reticle having a metal photomask layer formed on an optically transparent substrate and an imprinted resist material deposited on the metal photomask layer;
etching recessed regions of the imprinted resist material to expose portions of the metal photomask layer in a first etching step; and
etching the exposed portions of the metal photomask layer through the imprinted resist material in a second etching step, wherein both of the first and second etching steps utilize a plasma formed from a processing gas comprising an oxygen containing gas, a chlorine containing gas, and a halogen containing gas.

16. The method of claim 15, wherein the process gas utilized in both the first and second etching steps have different ratios of oxygen containing gas, chlorine containing gas, and halogen containing gas.

17. The method of claim 15, wherein the first and second etching steps are performed in the same processing chamber.

* * * * *

UNITED STATES PATENT AND TRADEMARK OFFICE
CERTIFICATE OF CORRECTION

PATENT NO. : 7,955,516 B2
APPLICATION NO. : 11/836258
DATED : June 7, 2011
INVENTOR(S) : Chandrachood et al.

Page 1 of 1

It is certified that error appears in the above-identified patent and that said Letters Patent is hereby corrected as shown below:

In claim 1, column 10, line 26, remove "the" before "using the";

In claim 5, column 10, line 62, remove "the" before "using the"; and

In claim 7, column 11, line 24, remove "the" before "using the".

Signed and Sealed this
Thirteenth Day of March, 2012

David J. Kappos
*Director of the United States Patent and Trademark Office*